United States Patent [19]

Kuga et al.

[11] Patent Number: 4,758,764
[45] Date of Patent: Jul. 19, 1988

[54] LIGHT-EMITTING DEVICE FOR AUTOMATIC FOCUS ADJUSTMENT APPARATUS

[75] Inventors: Ryuichiro Kuga, Katano; Yoshiaki Hirao, Habikino; Hiroyuki Asakura, Osaka; Yoshitomi Nagaoka, Neyagawa, all of Japan

[73] Assignee: Matsushita Electric Industrial Co., Ltd., Kadoma, Japan

[21] Appl. No.: 870,119

[22] Filed: Jun. 3, 1986

[51] Int. Cl.⁴ .......................................... H01L 33/00
[52] U.S. Cl. .................................. 313/499; 313/512; 313/111; 313/117
[58] Field of Search ............... 313/499, 512, 117, 111

[56] References Cited

U.S. PATENT DOCUMENTS

| | | | |
|---|---|---|---|
| 1,910,578 | 5/1933 | Tillyer | 313/117 X |
| 3,674,299 | 3/1972 | Lavalee | 313/499 X |
| 3,805,347 | 3/1974 | Collins et al. | 313/499 X |
| 3,876,900 | 4/1975 | Amatsuka et al. | 313/510 |
| 4,013,915 | 3/1977 | Dufft | |
| 4,441,810 | 4/1984 | Momose et al. | |
| 4,642,513 | 2/1987 | Nyul et al. | 313/512 X |

FOREIGN PATENT DOCUMENTS

| | | |
|---|---|---|
| 0137555 | 4/1985 | European Pat. Off. |
| 0140650 | 5/1985 | European Pat. Off. |
| 2209194 | 8/1973 | Fed. Rep. of Germany |
| 2632462 | 1/1978 | Fed. Rep. of Germany |
| 2,335,013 | 7/1977 | France |

OTHER PUBLICATIONS

Patent Abstracts of Japan, vol. 8, No. 231, (E-274)[1668], Oct. 24, 1984/No. 59-112668, 6/29/84, Fujitsu K.K., Hasegawa.
Patent Abstracts of Japan, vol. 8, No. 66, (E-234)[1503], Mar. 28, 1984/No. 58-216478, 12/16/83, Hitachi Seisakusho K.K., Yamada.
Patent Abstracts of Japan, vol. 7, No. 30, (P-173)[1175], Feb. 5, 1983/No. 57-181515, 11/9/82, Sumitomo Denki Kogyo K.K., Noda.
PCT International Publication No. WO 82/02800, 8/19/82, Varian Associates, Inc./Yeats.
Patent Abstracts of Japan, vol. 7, No. 144, (E-183)[1289], Jun. 23, 1983/No. 58-56482, 4/4/83, Shinkou Denki Kogyo K.K., Sudou.
Patent Abstracts of Japan, vol. 8, No. 217, (E-270)[1654], Oct. 4, 1984/No. 59-101882, 6/12/84, Nippon Denki K.K., Noguchi.

Primary Examiner—Palmer C. DeMeo
Attorney, Agent, or Firm—Wenderoth, Lind & Ponack

[57] ABSTRACT

In an automatic focus adjustment apparatus with a light-emitting device comprising a condenser lens and a light-emitting element which radiates light onto an object and adjusts the focal point according to a light reflected back from the object, undesired flare is eliminated by placing a diaphragm sufficiently close to the light-emitting element so that only the effective light from the element passes to the condenser lens by using a cap, an opaque paint or a spatial filter, and/or by applying a low reflectance paint to the inner wall of an outer casing of the light-emitting device.

16 Claims, 2 Drawing Sheets

LIGHT-EMITTING DEVICE FOR AUTOMATIC FOCUS ADJUSTMENT APPARATUS

BACKGROUND OF THE INVENTION

1. Field of the Invention

The present invention relates to a light-emitting device used in the automatic focus adjustment apparatus for a video camera or still camera.

2. Description of the Prior Art

Various systems have been proposed for the automatic focus adjustment apparatus which drives the image forming lens to be in a focusing position. Among them is a system which emits light to an object and detects reflected light from the object for focus adjustment (hereinafter referred to as an active system). U.S. Pat. No. 4,441,810 and European Patent Publication EP No. 0,140,650 A1 disclose this type of system; a light emitter and a photo sensor are positioned a specified distance apart from each other based on the principle of trigonometrical survey. Light from a light-emitting device is collected by a condenser lens and projected to an object. Reflected light from the object is condensed by a receiving lens and fed to the photo sensor, which photoelectrically detects the position of the centroid of the image formed by the reflected light to obtain distance imformation for focus adjustment.

The focus adjustment apparatus of the active system described above is based on the assumption that, when the distance between the apparatus and the object is fixed, the centroid of the spot image formed on the photo sensor by the reflected light is also fixed.

In the focus adjustment apparatus of the active system, the light-emitting device is normally an infrared ray-emitting diode (hereinafter abbreviated as IRED). Light from this device is collected by a condenser lens and then projected onto the object. At the same time, light reflected by the inner walls of the outer casing and the surface of the base of the device are also projected through the condenser lens onto the object; direct light forms a high intensity infrared light image at the center, surrounded by a lower intensity infrared light image (hereinafter referred to as a flare image) formed by light reflected from the inner walls of the outer casing and the surface of the base (hereinafter called flare). If the object has constant reflectance over its entire surface, the centroid of the spot image on the photo sensor is virtually fixed irrespective of the flare due to the flare's negligibly low light intensity. If the object has different reflectances, however, problems arise. Suppose that a higher intensity image is formed by direct light on a low reflectance area of the object while a lower intensity flare image is partly formed on a high reflectance area. In such a case, the light image formed on the sensor will have intensity distribution different from that for a constant reflectance subject. Since the flare image light intensity would be significantly high, the position of the centroid of the spot image would change. In other words, though the distance from the object is constant, the position of the centroid of the spot image changes on the photo sensor, resulting in an out-of-focus picture.

SUMMARY OF THE INVENTION

An object of the present invention is to provide a light-emitting device for an automatic focus adjustment apparatus which reduces undesired flare, thus minimizing erroneous focus adjustment.

To achieve this object, the light-emitting device of the present invention has means for reducing undesired flare reflected from the inner wall of the outer casing and the base and cover glass surface of the light-emitting device.

The flare reducing means may comprise a diaphragm provided near a light-emitting element of the light-emitting device. The diameter of the diaphragm aperture is larger than the solid angle of an imaginary cone extending from the light-emitting element to the effective diameter of a condenser lens provided in front of the device. Alternatively, the flare reducing means may comprise a low reflectance coating on the inner wall of the outer casing or the base surface of the device. Still further, the flare reducing means may comprise a spatial filter provided in front of the light-emitting element for passing only the light emitted from the light-emitting element.

In the present invention, the undesired flare is reduced by an extremely simple construction without decreasing the quantity of effective light necessary for focus adjustment so that erroneous focus adjustment can be minimized.

DESCRIPTION OF THE PREFERRED EMBODIMENTS

Figure 1:
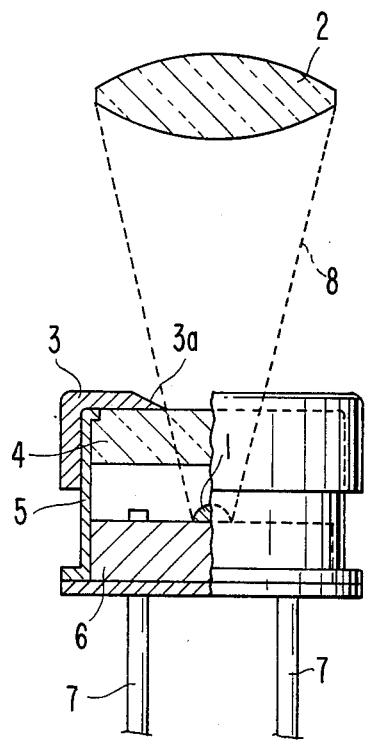
FIG. 1 is a partially-sectional side view showing a light-emitting device of a first embodiment according to the present invention.

FIG. 1 shows a light-emitting device of a first embodiment according to the present invention. Light rays radiated from a light-emitting element 1 are collected by a condenser lens 2 located in front of and at a predetermined distance from the light-emitting device; and projected onto an object (not shown). An outer casing 5 to which a cover glass 4 is fused is mounted on a base 6 so that the outer casing 5 forms a cylindrical side wall of the light-emitting device and the cover glass 4 forms a front wall of the light-emitting device. Reference numeral 7 designates a terminal; and 8 designates the solid angle of an imaginary cone extending from the light-emitting element 1 to the effective diameter of the condenser lens 2.

A cap 3 is mounted on the outer casing 5 and includes a diaphragm 3a for limiting the light rays reflected from the inner walls of the outer casing 5 and the base 6. The diaphragm 3a is a circular aperture formed in the cap 3 at the position opposite to the light-emitting element 1. The cap 3 is of a material which has a low reflectance to infrared light. The diaphragm 3a has a knife edge. The height of the outer casing 5 is low to enable the diaphragm aperture in the cap 3 to be placed close to the light-emitting element 1.

Here, for most effectively collecting the light emitted directly from the light-emitting element 1 to obtain the largest quantity of effective light contributing to focus adjustment, the diameter of the diagram aperture in the cap 3 may be somewhat larger than the diameter of the section through the imaginary cone at the position of the aperture. That is, the selected aperture diameter value $\phi$ may satisfy the following condition:

$$\phi > d(a-b)/l + b \tag{1}$$

where,
- a: Effective diameter of the condenser lens 2
- b: Diameter of the light-emitting element 1
- d: Distance between the base 6 and the diaphragm 3a
- l: Distance between the base 6 and the condenser lens 2

If the aperture diameter satisfies the condition (1), the quantity of effective light contributing to focus adjustment will not be reduced. The closer the cap 3 is placed to the light-emitting element 1, the more the aperture diameter can be reduced while maintaining the condition (1), thereby effectively reducing the light reflected from the inner walls of the outer casing 5 and the base 6 and the surface of the cover glass 4.

If the cover glass 4 is in contact with the cap 3, the flare from the cover glass 4 is eliminated.

Figure 2:
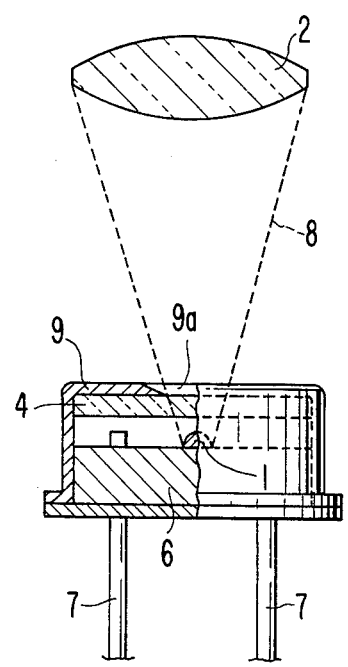
FIG. 2 is a partially-sectional side view showing a light-emitting device of a second embodiment according to the present invention.

FIG. 2 shows a second embodiment of the present invention. An outer casing 9 is provided with a circular aperture 9a at a surface opposing to the light-emitting element 1. The diameter of the aperture 9a is preferably as small as possible within a range satisfying the above condition (1). The closer the aperture 9a is placed to the light-emitting element 1, the smaller the diameter of the aperture 9a can be made, thereby further reducing the amount of flare reaching the condenser lens 2. This embodiment is different from that of FIG. 1 in that the additional cap need not be provided.

Figure 3A:
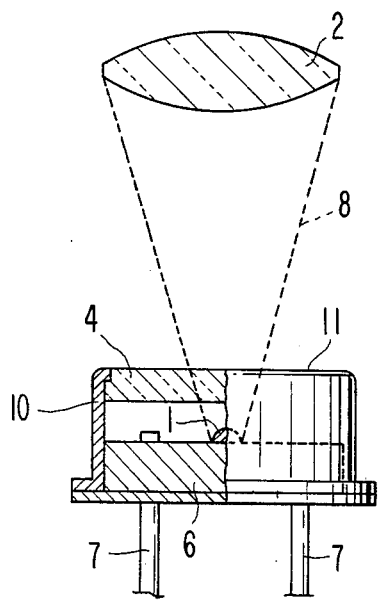
FIGS. 3(a) and 3(b) are a partially-sectional side view and a top view showing a light-emitting device of a third embodiment according to the present invention.
Figure 3B:
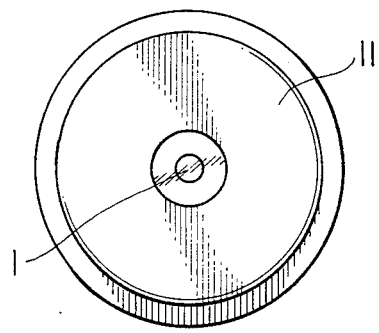

FIGS. 3 (a) and (b) show a light-emitting device of a third embodiment of the invention. The cover glass 4 is coated on an outer surface thereof with a low reflectance opaque paint 11 other than in a circular aperture area thereof. The aperture area is determined to satisfy the above condition (1). The height of the outer casing 10 is low to enable the aperture area formed by the opaque paint 11 to be placed closer to the light emitting element 1. In this embodiment, an effect identical to that achieved by the first embodiment is obtained by simply applying the opaque paint coating to the cover glass.

An screen printing method may be used to apply the paint. In addition to good dimensional accuracy, the screen printing has high productivity; a large number of light-emitting devices can be simultaneously painted at the same time at low cost.

Figure 4A:
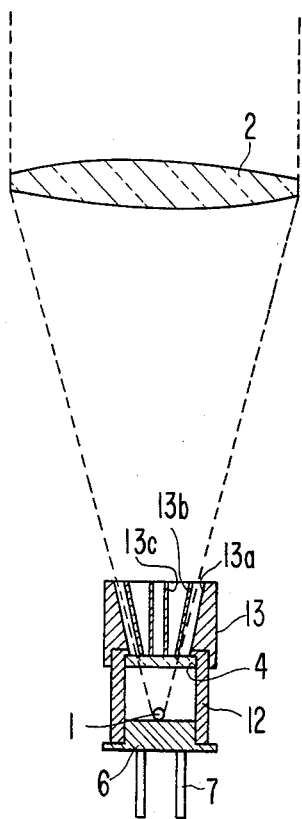
FIGS. 4 (a) and 4 (b) are a side sectional view and a top view showing a light-emitting device of a fourth embodiment according to the present invention.
Figure 4B:
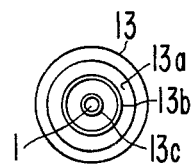

FIGS. 4 (a) and (b) show a fourth embodiment of the present invention. FIG. 4 (a) is a sectional view of a light-emitting device of the fourth embodiment and FIG. 4 (b) shows the top view of the same.

Light from the light emitting element 1 passes through the cover glass 4 and a spatial filter 13 mounted on the aperture of outer casing 12 and is collected by the condenser lens 2 for projection of light onto an object (not shown). The spatial filter 13 defines by an inner surface 13a thereof a semi-cone with the center of light emitting element 1 as the imaginary top and with the effective diameter of the condenser lens 2 as the imaginary bottom. Inside the spatial filter 13 are mounted thin, semi-cone-shaped shields 13b, 13c each with the center of light emitting element 1 as its imaginary top. The semi-cone-shaped surfaces 13a and the semi-cone-shaped shields 13b, 13c are arranged so that their center axes are placed on the optical axis of the condenser lens 2 on which the light-emitting element 1 is also placed. Accordingly, if the light-emitting device is viewed along the optical axis from the condenser lens 2, only the light-emitting element 1 can be seen through the spatial filter 13, but the base 6 and the inner wall of the outer casing 12 cannot be seen. Light radiated from the light-emitting element 1 passes through the spatial filter 13 and is projected onto the object through the condenser lens 2. The flare is blocked by the shields 13b, 13c in the spatial filter 13. The amount of the flare reaching the object can be further reduced by painting the surfaces of the shields 13b, 13c and the surface 13a black for lower reflectance.

Figure 5B:
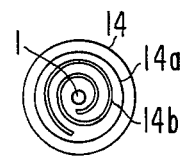
FIGS. 5 (a) and 5 (b) are a side sectional view and a top view showing a light-emitting device of a fifth embodiment according to the present invention.
Figure 5A:
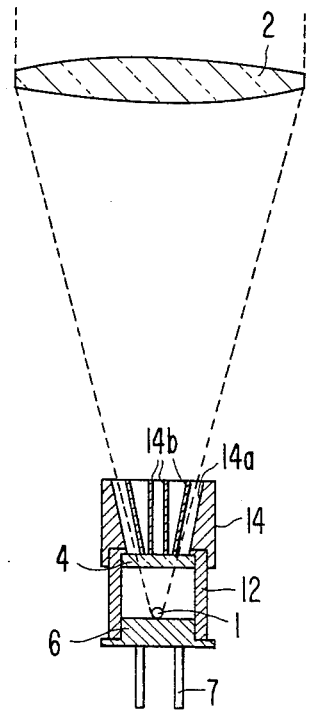

FIGS. 5 (a) and (b) show a fifth embodiment of the present invention. FIG. 5 (a) is a sectional view of a light-emitting device of the fifth embodiment and FIG. 5 (b) is a top view of the same.

The light-emitting device in FIG. 5 (a) is the same as that in FIG. 4 (a) except for the spatial filter 14. While in FIG. 4 (a) the spatial filter 13 is composed of a plurality of co-axial semi-conical shields, in FIG. 5 (a) the space filter 14 is composed of a shielding sheet 14b circinated into cone shape. The fifth embodiment thus provides the same effect as the fourth embodiment, but it reduces the number of components.

Figure 6:
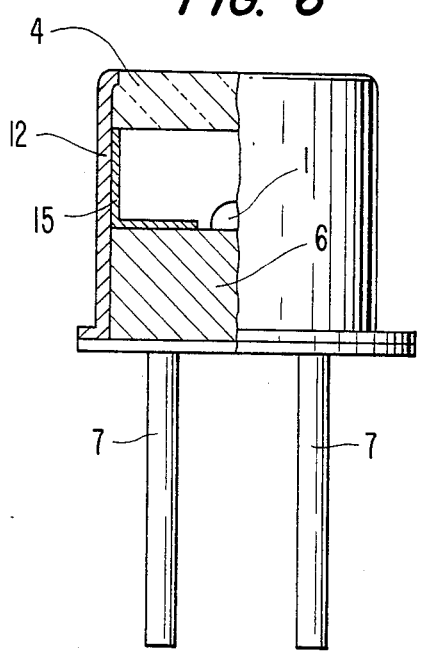
FIG. 6 is a partially-sectional side view showing a light-emitting device of a sixth embodiment according to the present invention.

FIG. 6 shows a sixth embodiment of the present invention.

In this embodiment, a black ink or paint 15 is coated on the inner wall of the outer casing 12 and the surface of the base 6, substantially reducing their reflection. Flare therefrom is thus significantly reduced.

The same effect can be obtained by using low reflectance material for the inner wall of outer casing 12 and the surface of the base 6.

As described above, the present invention uses an extremely simple construction to minimize undesired flare from the light-emitting device, thus substantially reducing erroneous focus adjustment when an object has reflectance distribution. Two or more of the above embodiments may be employed in combination to double flare reduction effect. For instance, it is possible to paint the cover glass black, as indicated in the third embodiment, while also painting the inner walls of the outer casing and base surface, as indicated in the sixth embodiment.

What is claimed is:

1. A light-emitting device for use in an automatic focus adjusting apparatus for a camera comprising:
   a light-emitting element for emitting light;
   a base having said light-emitting element mounted thereon;
   an outer casing for forming a side wall of said light-emitting device and encasing therein said base and said light-emitting element;
   a cover glass placed in front of said light-emitting element and attached to said outer casing and forming a front wall of said light-emitting device for passing light directly therethrough; and
   means provided on an outer surface of said cover glass for reducing the amount of flare light reflected from an inner wall of said casing and a surface of said base which is passed by said means and for passing, of the light emitted directly from said light-emitting element substantially the amount as is effectively used for focus adjustment.

2. The light-emitting device according to claim 1, wherein said means comprises a cap covering said outer casing, said cap having a center aperture for passing therethrough substantially only the light emitted from said light-emitting element.

3. The light-emitting device according to claim 1, wherein said means comprises a low reflectance material coated at least on the inner wall of said outer casing or the surface of said base.

4. The light-emitting device according to claim 1, wherein said means comprises a spatial filter placed in front of said light-emitting element for passing therethrough substantially only the light emitted from said light emitting element.

5. The light-emitting device according to claim 1, wherein said spatial filter comprises a plurality of semi-cone shields, said light-emitting element being placed at a position corresponding to an imaginary apex of each of said semi-cone shields.

6. The light-emitting device according to claim 1, wherein said means comprises a part of said outer casing opposing to said light-emitting element, said part having a center aperture for passing therethrough substantially only the light emitted from said light-emitting element.

7. In an automatic focus adjusting apparatus for a camera the combination of a light-emitting device for emitting a light and a condenser lens located in front of and at a predetermined distance from said light-emitting device for collecting the emitted light, said light-emitting device comprising a light-emitting element for emitting light, a base having mounted thereon said light-emitting element, an outer casing forming a side wall of said light-emitting device for encasing therein said base and said light-emitting element, a cover glass placed in front of said light-emitting element and attached to said outer casing to form a front wall of said light-emitting element for passing light directly therethrough, and means provided on an outer surface of said cover glass for passing the light emitted directly from said light-emitting element, substantially the amount which is directed directly to said condenser lens and for reducing the amount of flare light reflected from an inner wall of said outer casing and a surface of said base which is passed by said means.

8. The combination according to claim 7, wherein said means comprises a cap covering said outer casing, said cap having a center aperture for passing therethrough substantially only the light emitted from said light-emitting element.

9. The combination according to claim 8, wherein the diameter of said center aperture is larger than a solid angle of an imaginary cone defined by the diameter of said condenser lens as a bottom and the center of said light-emitting element as a top.

10. The combination according to claim 7, wherein said means comprises a low reflectance material coated at least on the inner wall of said outer casing or the surface of said base.

11. The combination according to claim 7, wherein said means comprises a spatial filter placed in front of said light-emitting element for passing therethrough substantially only the light emitted from said light-emitting element.

12. The combination according to claim 11, wherein said spatial filter comprises a plurality of semi-cone shields, said light-emitting element being placed at a position corresponding to an imaginary apex of each of said semi-cone shields.

13. The combination according to claim 7, wherein said means comprises a part of said outer casing opposing to said light-emitting element, said part having a center aperture for passing therethrough substantially only the light emitted from said light-emitting element.

14. The combination according to claim 8, wherein the diameter of said center aperture is larger than a solid angle of an imaginary cone defined by the diameter of said condenser lens as a bottom and the center of said light-emitting element as a top.

15. A light-emitting device for use in an automatic focus adjusting apparatus for a camera, comprising:
a light-emitting element for emitting light;
a base having said light-emitting element mounted thereon;
an outer casing forming a side wall of said light-emitting device and encasing therein said base and said light-emitting element; and
a cover glass place in front of said light-emitting element and forming a front wall of said light-emitting device for passing light directly therethrough, and an outer surface of said cover glass being coated with a low reflectance opaque paint other than in a center aperture area thereof opposed to said light-emitting element, said center aperture area having an area for reducing the passage of flare light reflected from an inner wall of said outer casing and a surface of said base by blocking the flare light by said opaque paint, and for passing, of the light emitted directly from said light-emitting element, substantially the amount which is effectively used for focus adjustment.

16. In an automatic focus adjusting apparatus for a camera, the combination of a light-emitting device for emitting light and a condenser lens located in front of and at a predetermined distance from said light-emitting device for collecting the emitted light, said light-emitting device comprising a light-emitting element for emitting light, a base with said light-emitting element mounted thereon, an outer casing forming a side wall of said light-emitting device for encasing therein said base and said light-emitting element, a cover glass placed in front of said light-emitting element and attached to said outer casing and forming a front wall of said light-emitting device for passing light directly therethrough, and a coating on an outer surface of said cover glass of a low reflectance opaque paint other than in a center aperture area thereof opposed to said light-emitting element, said center aperture area having an area for reducing the passage of flare light reflected from an inner wall of said outer casing and a surface of said base by blocking the flare light by said opaque paint, and for passing, of the light emitted directly from said light-emitting element, substantially the amount which is effectively used for focus adjustment.

* * * * *